(12) United States Patent
Pöchmüller

(10) Patent No.: US 6,487,108 B2
(45) Date of Patent: Nov. 26, 2002

(54) MRAM CONFIGURATION

(75) Inventor: Peter Pöchmüller, Colchester, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/898,257

(22) Filed: Jul. 3, 2001

(65) Prior Publication Data

US 2002/0001243 A1 Jan. 3, 2002

(30) Foreign Application Priority Data

Jul. 3, 2000 (DE) .......................................... 100 32 277

(51) Int. Cl.[7] .............................................. G11C 11/00
(52) U.S. Cl. ........................................ 365/158; 365/226
(58) Field of Search .............................. 365/158, 226, 365/189.11, 227

(56) References Cited

U.S. PATENT DOCUMENTS

| | | | |
|---|---|---|---|
| 4,262,340 A | | 4/1981 | Sasaki et al. ................ 365/154 |
| 4,583,202 A | | 4/1986 | Konishi ................... 365/189.09 |
| 5,373,477 A | * | 12/1994 | Sugibayashi ................. 365/226 |
| 5,563,838 A | * | 10/1996 | Mart et al. ................... 365/226 |
| 5,894,447 A | | 4/1999 | Takashima .................... 365/158 |
| 6,038,178 A | * | 3/2000 | Oh ......................... 365/189.11 |
| 6,041,005 A | * | 3/2000 | Yi et al. ..................... 365/226 |
| 6,385,115 B1 | * | 5/2002 | Nakai .......................... 365/226 |

FOREIGN PATENT DOCUMENTS

EP 0 478 251 A2 4/1992

* cited by examiner

Primary Examiner—Tan T. Nguyen
(74) Attorney, Agent, or Firm—Laurence A. Greenberg; Werner H. Stemer; Gregory L. Mayback

(57) ABSTRACT

A magneto-resistive random access memory (MRAM) configuration is described in which a plurality of memory cell blocks are supplied with operating voltages that differ from one another in each case. This results in that the chip voltage supply of about 2 to 3 V can be better utilized. The memory cell blocks are formed of memory cells disposed at crossover points of word lines and bit lines.

4 Claims, 1 Drawing Sheet

MRAM CONFIGURATION

BACKGROUND OF THE INVENTION

Field of the Invention

The present invention relates to a MRAM configuration having a memory chip which, between a voltage supply and a memory cell array, has a voltage stabilizer device. The voltage stabilizer device supplies a fixed operating voltage to the memory cell array via word and/or bit lines, in which case a voltage drop occurs between the input of the word and/or bit lines which are connected to the voltage stabilizer device and the output of the lines.

A memory cell is programmed by application of a magnetic field. In order to program a memory cell to a value "0" or "1", the magnetic field must exceed certain threshold values.

A problem that generally arises in MRAMs resides in the relatively high power or energy consumption. The latter is due to the fact that the voltage drop along a MRAM cell generally does not exceed 0.5 V for technological reasons. This inherently has the advantage that the word lines and bit lines operate at a relatively low voltage of 0.5 V, for example. However, the supply voltage on a memory chip is significantly higher, being 2 to 3 V, in particular. For this reason, in the existing MRAM configurations, a voltage stabilizer device is provided between the voltage supply of 2 to 3 V and the actual memory cell array with the word lines and the bit lines. The voltage stabilizer device transforms the supply voltage of 2 to 3 V into 0.5 V, which is then impressed on the word line via a word line driver. The rest of the word lines are provided with corresponding voltage stabilizer devices.

Since there is a voltage drop of 0.5 V on each word line in the memory cell array, 0 V are then present at the output of the word lines.

The transformation of the supply voltage of 2 to 3 V into 0.5 V results in that the majority of the energy or power is "wasted", since, of the 2 to 3 V of supply voltage that are made available to the voltage stabilizer device, merely 0.5 V, that is to say between 16% and 25%, is actually utilized, while the remaining 84 to 75% is unutilized.

For understandable reasons, such an energy or power balance is extremely unsatisfactory and should be avoided if possible. Nevertheless, hitherto there has not been a solution to this problem, since the MRAM cells indeed require only about 0.5 V, while the general memory chip voltage supply has values of 2 to 3 V.

SUMMARY OF THE INVENTION

It is accordingly an object of the invention to provide a MRAM configuration that overcomes the above-mentioned disadvantages of the prior art devices of this general type, in which the memory chip voltage supply is better utilized, so that practically no power losses occur.

With the foregoing and other objects in view there is provided, in accordance with the invention, a magnetoresistive random access memory (MRAM) configuration containing a memory chip. The memory chip is formed of lines including bit lines and word lines and a memory cell array subdivided into a plurality of memory cell blocks and connected to the lines running through the memory cell array. The bit lines and word lines running through the memory cell blocks have input sides and output sides with regards to each of the memory cell blocks. A voltage stabilizer device is provided and receives a supply voltage. The voltage stabilizer device is connected to at least one of the bit lines and the word lines. The at least one of the bit lines and the word lines connected to the voltage stabilizer device functions as supply lines supplying fixed operating voltages to the memory cell array. A voltage drop occurs between the input sides of the supply lines and the output sides of the supply lines running through each of the memory cell blocks. The voltage stabilizer device has a plurality of voltage stabilizers and each of the memory cell blocks is respectively connected to one of the voltage stabilizers. The voltage stabilizers are connected to the supply lines and supply the memory cell blocks with the fixed operating voltages that differ from one another in each case.

In the case of a MRAM configuration of the type mentioned in the introduction, the object is achieved according to the invention by virtue of the fact that the memory cell array is subdivided into a plurality of memory cell blocks and the voltage stabilizer device supplies the memory cell blocks with fixed operating voltages that differ from one another in each case. In this case, the voltage stabilizer device may contain a plurality of voltage stabilizers and each memory cell block may be respectively assigned a voltage stabilizer. Preferably, the output of the word and/or bit lines of a first memory cell block, as a voltage supply, is connected to the input of the voltage stabilizer of a second memory cell block, and so on.

Thus, according to the invention, the MRAM configuration is subdivided into a plurality of memory cell blocks, in each individual memory cell block the word lines and the bit lines being driven by operating voltages that differ from the other memory cell blocks.

In accordance with an added feature of the invention, the memory cell blocks include a first memory cell block and a second memory cell block. The voltage stabilizers each have an input and a respective output side of a respective supply line of the first memory cell block is connected to the input of a respective voltage stabilizer connected to the second memory cell block and supplies the supply voltage to the input of the respective voltage stabilizer.

In accordance with another feature of the invention, controlled word line drivers are provided, and one of the controlled word line drivers is disposed between each of the voltage stabilizers and each of the memory cell blocks.

Other features which are considered as characteristic for the invention are set forth in the appended claims.

Although the invention is illustrated and described herein as embodied in a MRAM configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
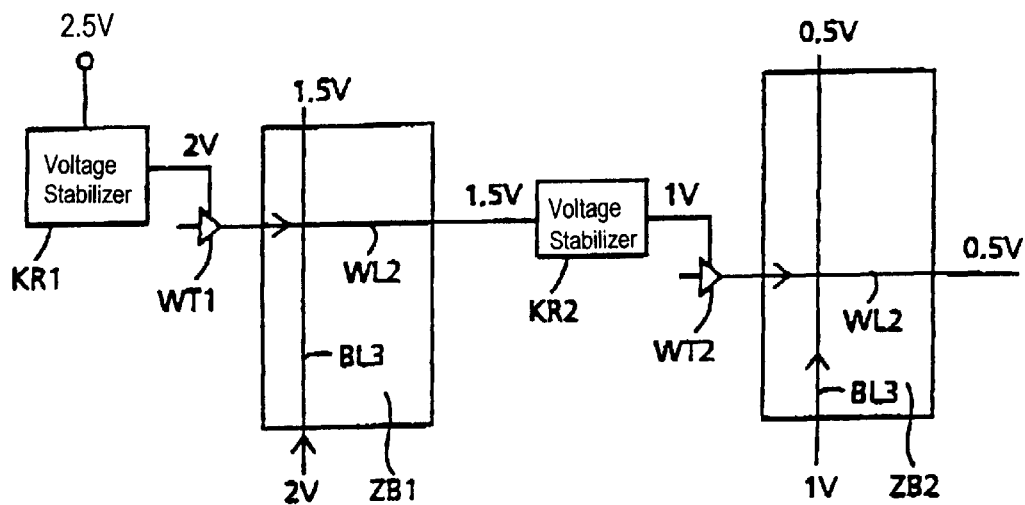
FIG. 1 is a block diagram of a MRAM configuration according to the invention.

In all the figures of the drawing, sub-features and integral parts that correspond to one another bear the same reference symbol in each case. Referring now to the figures of the drawing in detail and first, particularly, to FIG. 2 thereof, there is shown a memory cell array of a conventional magnetoresistive random access memory (MRAM) configuration. The latter contains word lines WL1, WL2, WL3, . . . and bit lines BL1, BL2, BL3, BL4, . . . , which cross the word lines WL1, WL2, WL3, . . . essentially perpendicularly. Memory cells are located at the crossover points between the word lines WL1, WL2, WL3, . . . and the bit lines BL1, BL2, BL3, BL4,. The memory cells each being indicated by a resistor R11, R12, . . . R33, R34, generally Rij.

The resistor Rij represents the path of a tunneling current which flows between a word line, for example the word line WL2, and a bit line, for example the bit line BL3, when there is a voltage difference between the word line WL2 and the bit line BL3. The tunneling current then assumes a larger or smaller value depending on a magnetic field written to the memory cell. In other words, the memory cell can be understood as a binary resistor that is programmed with a larger or smaller resistance. The information unit "1" or "0" can then be assigned to these two resistances.

A memory cell is thus programmed by application of a magnetic field. In order to program a memory cell to a value "0" or "1", the magnetic field must exceed certain threshold values. In this case, it should be noted that the memory cell has a magnetic hysteresis.

Figure 2:
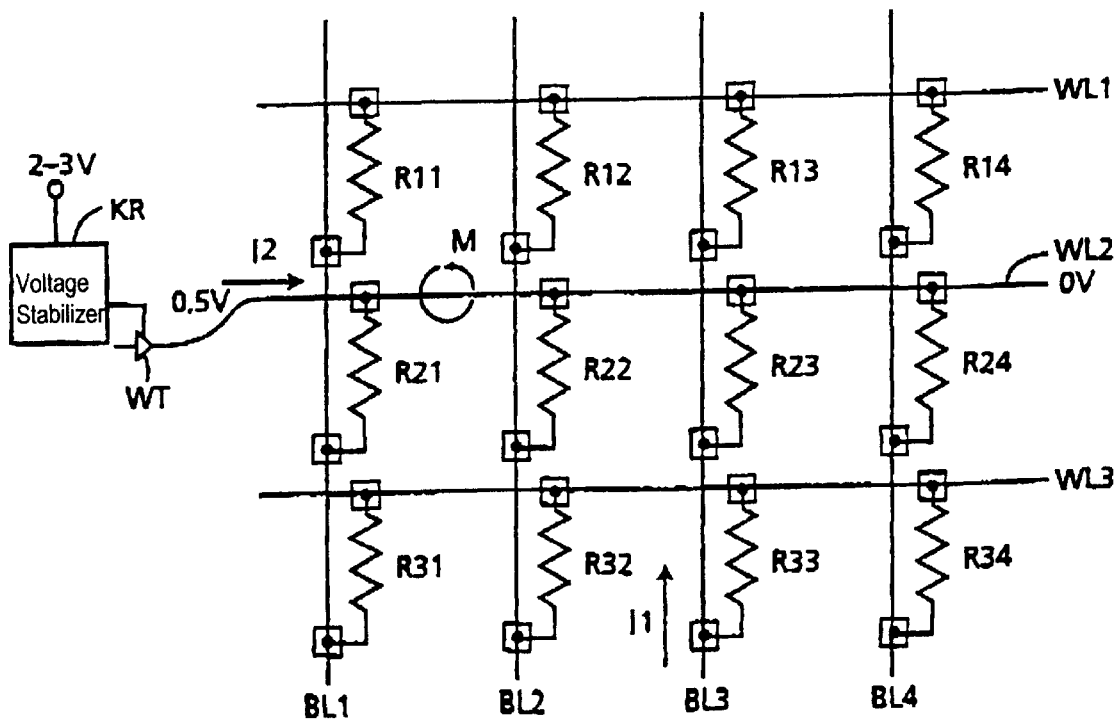
FIG. 2 is a schematic circuit diagram of a known MRAM configuration.

As is indicated in FIG. 2, by way of example, a direct current I2 flowing in the word line WL2 effects a magnetic field M around the word line WL2. The direction of the magnetic field M is reversed in this case if the current I2 flows in the opposite direction. The direction of the magnetic field M specifies, then, whether a "1" or "0" is written to a memory cell. Suppose, then, that the current I2 in the word line WL2 signifies the information unit "1". All the memory cells that are connected to the word line WL2, that is to say the memory cells with the resistors R21, R22, R23 and R24, have the magnetic field M applied to them by the current I2. The hysteresis of the memory cells with the resistors R21, R22, R23 and R24 has the effect that the magnetic field M by itself is still not strong enough to bring all these memory cells from a "0" state to a "1" state. Rather, a bit line, for example the bit line BL3, must additionally be driven by a current I1 in order to generate at the interface between the bit line BL3 and the word line WL2 a magnetic field which, through superposition of the magnetic fields generated by the currents I1 and I2, is strong enough to transfer for example the "0" state to a "1" state at the interface, that is to say in the resistor R23. In other words, by driving selected word lines WLi and selected bit lines BLj, it is possible to program the memory cells at the interfaces between the word and bit lines into a "0" or "1" state—depending on the direction of the magnetic field generated by the respective currents.

A problem that generally arises in MRAMs resides in the relatively high power or energy consumption. The latter is due to the fact that the voltage drop along an MRAM cell generally does not exceed 0.5 V for technological reasons. This inherently has the advantage that the word lines and bit lines operate at a relatively low voltage of 0.5 V, for example. However, the supply voltage on a memory chip is significantly higher, being 2 to 3 V, in particular. For this reason, in the existing MRAM configurations, a voltage stabilizer device KR is provided between the voltage supply of 2 to 3 V and the actual memory cell array with the word lines WLi and the bit lines BLj. This is shown for the word line WL2 in FIG. 2. The voltage stabilizer device KR transforms the supply voltage of 2 to 3 V into 0.5 V, which is then impressed on the word line WL2 via a word line driver WT. The rest of the word lines WL1, WL3, . . . are provided with corresponding voltage stabilizer devices. Since there is a voltage drop of 0.5 V on each word line in the memory cell array, 0 V is then present at the output of the word lines, that is to say the word line WL2 for example, as is indicated in FIG. 2.

The transformation of the supply voltage of 2 to 3 V into 0.5 V results in that the majority of the energy or power is "wasted", since, of the 2 to 3 V of supply voltage that are made available to the voltage stabilizer device KR, merely 0.5 V, that is to say between 16% and 25%, is actually utilized, while the remaining 84 to 75% is unutilized.

For understandable reasons, such an energy or power balance is extremely unsatisfactory and should be avoided if possible.

Nevertheless, hitherto there has not been a solution to this problem, since the MRAM cells indeed require only about 0.5 V, while the general memory chip voltage supply has values of 2 to 3 V.

The solution to this problem and according to the invention is shown in FIG. 1. FIG. 1 shows cell blocks ZB1 and ZB2, which are each constructed in the same way as the memory cell array of FIG. 2 with the word lines WL1, WL2, WL3, . . . and the bit lines BL1, BL2, BL3, BL4, . . . and also the individual memory cells formed from the resistors R11, R12, . . . R33, R34. As an example, just the word lines WL2 and the bit lines BL3 in the memory cell blocks ZB1 and ZB2 are illustrated here.

The memory chip voltage supply is intended to supply here as is typical—a supply voltage of about 2.5 V. The supply voltage of about 2.5 V is fed to a first voltage stabilizer KR1, which yields from it a constant voltage of 2 V. The voltage of 2 V is fed via a first controlled word line driver WT1 to the word line WL2 of the memory cell block ZB1. The rest of the word lines and also bit lines are provided with corresponding voltage stabilizers KR1 at their respective input.

On account of the voltage drop of about 0.5 V, a voltage of approximately 1.5 V is then present at the output of the word line WL2 after the first cell block ZB1. The voltage of 1.5 V is fed to a second voltage stabilizer KR2. The second voltage stabilizer then generates from the "supply voltage" of approximately 1.5 V a constant voltage of 1 V, which is applied via a second word line driver WT2 as "+1 V" to the word line WL2 of the second memory cell block ZB2.

Voltage stabilizers similar to the voltage stabilizer KR2 are connected, on the input side, to the outputs of the remaining word lines and bit lines of the memory cell block ZB1 and, on the output side, to the inputs of the remaining word lines and bit lines of the memory cell block ZB2. As a result, all the word lines and bit lines of the memory cell block ZB2 are supplied with constant 1 V or −1 V. About 0.5 V is then available in each case at the outputs of the word lines and bit lines of the memory cell block ZB2 and, if appropriate, can additionally be fed to a third memory cell block after further voltage stabilization.

It can be seen from the above exemplary embodiment that the invention at the very least readily enables doubled utilization of the available supply voltage of about 2.5 V, if a voltage drop of 0.5 V is assumed in each memory cell block and a reliable constant voltage must be ensured for each memory cell block.

I claim:

1. A magneto-resistive random access memory (MRAM) configuration, comprising:

a memory chip, containing:
lines including bit lines and word lines;
a memory cell array subdivided into a plurality of memory cell blocks and connected to said lines running through said memory cell array, said bit lines and word lines running through said memory cell blocks have input sides and output sides with regards to each of said memory cell blocks; and
a voltage stabilizer device receiving a supply voltage, said voltage stabilizer device connected to at least one of said bit lines and said word lines, said at least one of said bit lines and said word lines connected to said voltage stabilizer device functioning as supply lines supplying fixed operating voltages to said memory cell array, a voltage drop occurs between said input sides of said supply lines and said output sides of said supply lines running through each of said memory cell blocks, said voltage stabilizer device having a plurality of voltage stabilizers and each of said memory cell blocks is respectively connected to one of said voltage stabilizers, said voltage stabilizers connected to said supply lines and supplying said memory cell blocks with the fixed operating voltages that differ from one another in each case.

2. The MRAM configuration according to claim 1, wherein:

said memory cell blocks include a first memory cell block and a second memory cell block;

said voltage stabilizers each have an input; and a respective output side of a respective supply line of said first memory cell block is connected to said input of a respective voltage stabilizer connected to said second memory cell block and supplies the supply voltage to said input of said respective voltage stabilizer.

3. The MRAM configuration according to claim 1, including controlled word line drivers, one of said controlled word line drivers disposed between each of said voltage stabilizers and each of said memory cell blocks.

4. A magneto-resistive random access memory (MRAM) configuration, comprising:

lines including bit lines and word lines crossing said bit lines;

a memory cell array having memory cells disposed at cross-over points of said lines running through said memory cell array, said memory cell array subdivided into a plurality of memory cell blocks disposed successively in a direction of one of said lines, said lines run through said memory cell blocks and define input sides and output sides with regards to each of said memory cell blocks; and a voltage stabilizer device having a plurality of voltage stabilizers each receiving a supply voltage, said voltage stabilizers connected to at least one of said word lines and said bit lines, said at least one of said word lines and said bit lines connected to said voltage stabilizers function as supply lines supplying fixed operating voltages to said memory cell array, a voltage drop occurs between said input sides of said supply lines and said output sides of said supply lines, one of said voltage stabilizers connected to one of said supply lines upstream of each of memory cell blocks and said voltage stabilizers supplying said memory cell blocks with the fixed operating voltages that differ from one another in each case in a successive direction of said memory cell blocks.

* * * * *